(12) United States Patent
Yu et al.

(10) Patent No.: US 10,672,843 B2
(45) Date of Patent: Jun. 2, 2020

(54) DISPLAY PANEL AND DISPLAY DEVICE

(71) Applicant: WuHan TianMa Micro-Electronics Co., Ltd., Wuhan (CN)

(72) Inventors: Chujie Yu, Wuhan (CN); Shanfu Yuan, Wuhan (CN); Tao Peng, Wuhan (CN); Ruiyuan Zhou, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/243,293

(22) Filed: Jan. 9, 2019

(65) Prior Publication Data
US 2020/0006449 A1    Jan. 2, 2020

(30) Foreign Application Priority Data
Jun. 29, 2018  (CN) .......................... 2018 1 0701468

(51) Int. Cl.
| | | |
|---|---|---|
| H01L 27/32 | (2006.01) | |
| H01L 51/52 | (2006.01) | |
| H01L 51/00 | (2006.01) | |
| H01L 27/02 | (2006.01) | |
| H02H 9/04  | (2006.01) | |

(52) U.S. Cl.
CPC ...... *H01L 27/3244* (2013.01); *H01L 27/3276* (2013.01); *H01L 51/0097* (2013.01); *H01L 51/5246* (2013.01); *H02H 9/045* (2013.01); *H01L 2251/5338* (2013.01)

(58) Field of Classification Search
CPC .................. H01L 23/585; H01L 23/60; H01L 2251/5338; H01L 51/0096–0097; H01L 27/124; H01L 27/3225; H01L 27/3241–3244; H01L 27/3276; H01L 51/5237–525; H01L 27/0248; H01L 27/0266–027; H01L 27/0288–0296
See application file for complete search history.

(56) References Cited

U.S. PATENT DOCUMENTS

2016/0181345 A1\* 6/2016 Lee .................... H01L 27/3276
257/40

FOREIGN PATENT DOCUMENTS

| CN | 206148473 U | 5/2017 |
|---|---|---|
| CN | 107112348 A | 8/2017 |

OTHER PUBLICATIONS

Chinese OA dated Mar. 3, 2020 for corresponding CN Application No. 201810701468.1.

\* cited by examiner

*Primary Examiner* — Sonya D. McCall-Shepard
(74) *Attorney, Agent, or Firm* — Tarolli, Sundheim, Covell & Tummino LLP

(57) ABSTRACT

A display panel and a display device are provided. The display panel is divided into a display region and a non-display region, wherein the display panel includes: a first blocking wall arranged in the non-display region and surrounding the display region; a bending part; and an electrostatic protection unit arranged in a part of the non-display region corresponding to the bending part and located on a side of the first blocking wall facing away from the display region. By the arrangement of the electrostatic protection unit, problems such as breakdown of the transistors due to electrostatic accumulation caused by bending operation of the display panel, as well as encapsulation structure failure due to damage to the first blocking wall can be avoided.

20 Claims, 11 Drawing Sheets

100

100

DISPLAY PANEL AND DISPLAY DEVICE

CROSS-REFERENCE TO RELATED APPLICATIONS

The present disclosure claims priority to Chinese Patent Application No. 201810701468.1, filed on Jun. 29, 2018, the content of which is incorporated herein by reference in its entirety.

TECHNICAL FIELD

The present disclosure relates to the field of display technologies, and particularly, to a display panel and a display device.

BACKGROUND

At present, display technologies have been applied to every aspect of people's daily life, and accordingly, more and more materials and technologies have been used for display screens. Nowadays, mainstream display screens mainly include liquid crystal display screens and organic light-emitting diode display screens. Due to the self-luminous performance of the organic light-emitting diode display, the most energy-consuming backlight module is omitted compared with the liquid crystal display, so that it has the advantage of being more energy-saving. In addition, the organic light-emitting diode display also has the characteristics of flexible and bendable. By using a flexible substrate, a plurality of conductive layers are sequentially formed on the flexible substrate, including a thin film transistor driving array layer, an anode layer, an organic light-emitting layer, a cathode layer, and a thin-film encapsulation layer, so that OLED display screens have excellent bendability.

As the users' requirements on flexible bendability or folding performance of the display terminal product becomes more and more demanding, the stability of the performance of the flexible display product and the number of anti-bending are also required to be higher and higher. Meanwhile, the electrostatic accumulation is easily generated inside the display panel during the bending operation, which is greatly harmful to the bendable display panel.

SUMMARY

In view of the above, the present disclosure provides a display panel and a display device. By arranging an electrostatic protection unit in a non-display region (i.e., the left and right block regions in the non-display region of the display panel) of the bending part in the display panel, the static electricity generated during the bending operation is released, thereby preventing the electrostatic accumulation caused by the bending operation causing breakdown of the transistor in the display region, and also preventing a series adverse effects on the electronic components such as metal trace and light-emitting units of the display panel. In addition, with the embodiments of the present invention, by providing the electrostatic protection unit in an encapsulation structure such as a first blocking wall region near the bending part, it is possible to prevent loss of the first blocking wall due to electrostatic accumulation in the bending part which can cause failure of the encapsulation structure and the like.

In a first aspect of the present disclosure, a display panel is provided. The display panel is divided into a display region and a non-display region, wherein the display panel includes: a first blocking wall arranged in the non-display region and surrounding the display region; a bending part; and an electrostatic protection unit arranged in a part of the non-display region corresponding to the bending region and located on a side of the first blocking wall facing away from the display region.

In a second aspect of the present disclosure, a display device is provided. The display device includes any of the display panel provided in the present disclosure.

With the organic light-emitting display panel and the display device provided by the embodiments of the present disclosure, an electrostatic protection unit is arranged in a non-display region (i.e., the left and right block regions in the non-display region of the display panel) of the bending part in the display panel. According to the requirements for an actual product design, different electrostatic protection structures can be selected, and the electrostatic protection unit can be accessed to a large-area constant potential trace in the display panel to perform electrostatic discharge, and of course, the electrostatic protection unit can be externally connected to a constant potential such as the ground potential on the non-display panel. In addition, in the embodiments of the present disclosure, by arranging an electrostatic protection unit in a encapsulation structure such as a first blocking wall region near the bending part, it is possible to prevent loss of the first blocking wall due to electrostatic accumulation in the bending part which can cause the failure of the encapsulation structure and the like.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects before and after the "/" is an "or" relationship.

It should be understood that although the terms 'first', 'second' and 'third' may be used in the present disclosure to describe electrostatic protection units, these electrostatic protection units should not be limited to these terms. These terms are used only to distinguish the electrostatic protection units from one another. For example, without departing from the scope of the embodiments of the present disclosure, a first electrostatic protection unit may also be referred to as a second electrostatic protection unit. Similarly, the second electrostatic protection unit may also be referred to as the first electrostatic protection unit.

Figure 2:
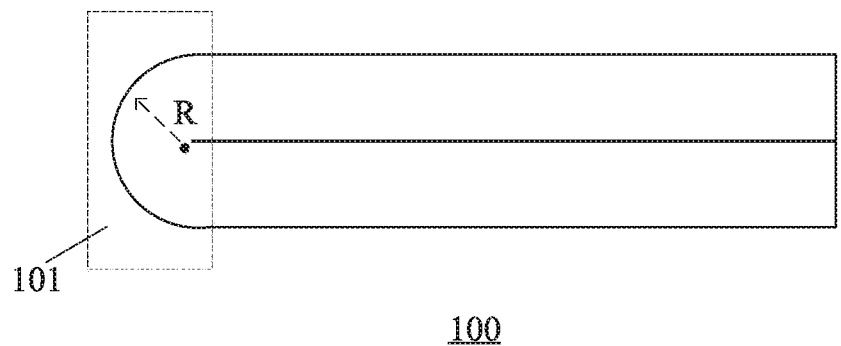
FIG. 2 is a schematic diagram showing the display panel in FIG. 1 in a bent state.
Figure 3:
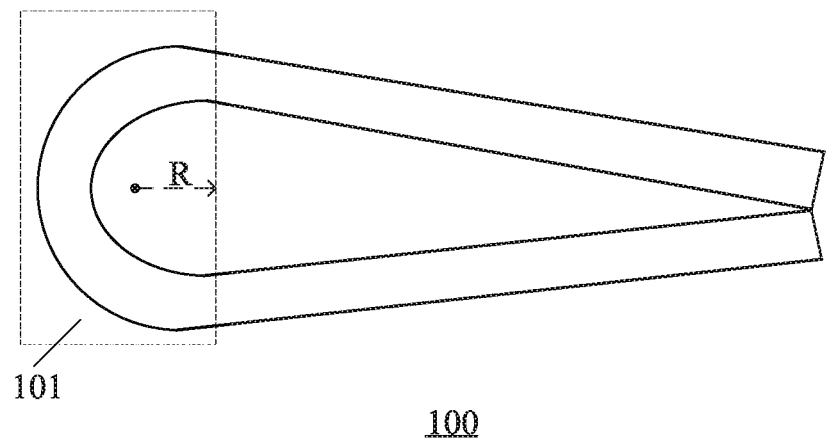
FIG. 3 is a schematic diagram showing the display panel in FIG. 1 in another bent state.
Figure 4:
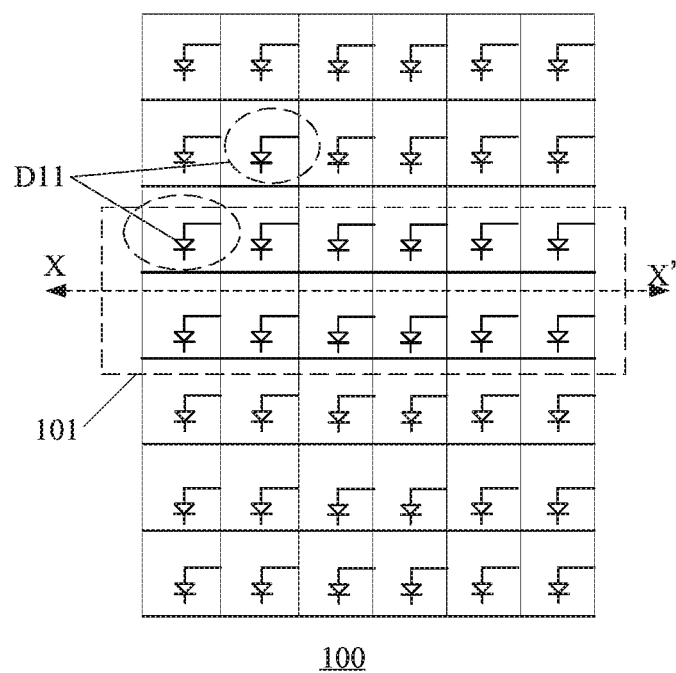
FIG. 4 is another schematic diagram showing the display panel in FIG. 1.
Figure 5:
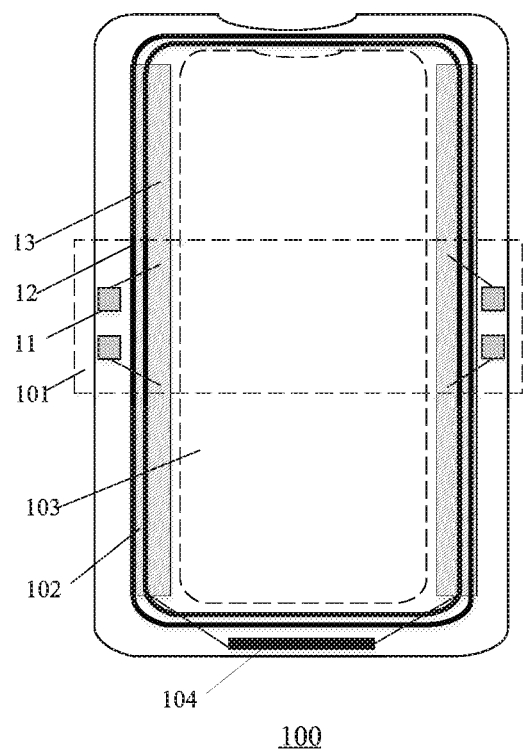
FIG. 5 is another schematic diagram showing the display panel in FIG. 1.
Figure 6:
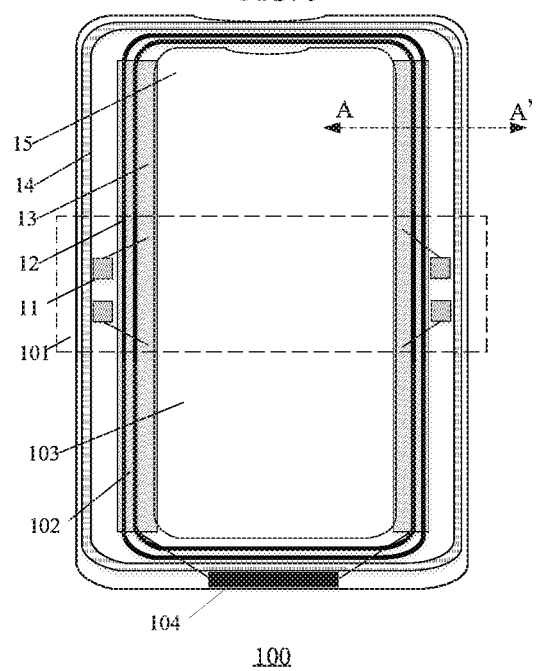
FIG. 6 is a structural schematic diagram showing a display panel according to another embodiment of the present disclosure.
Figure 7:
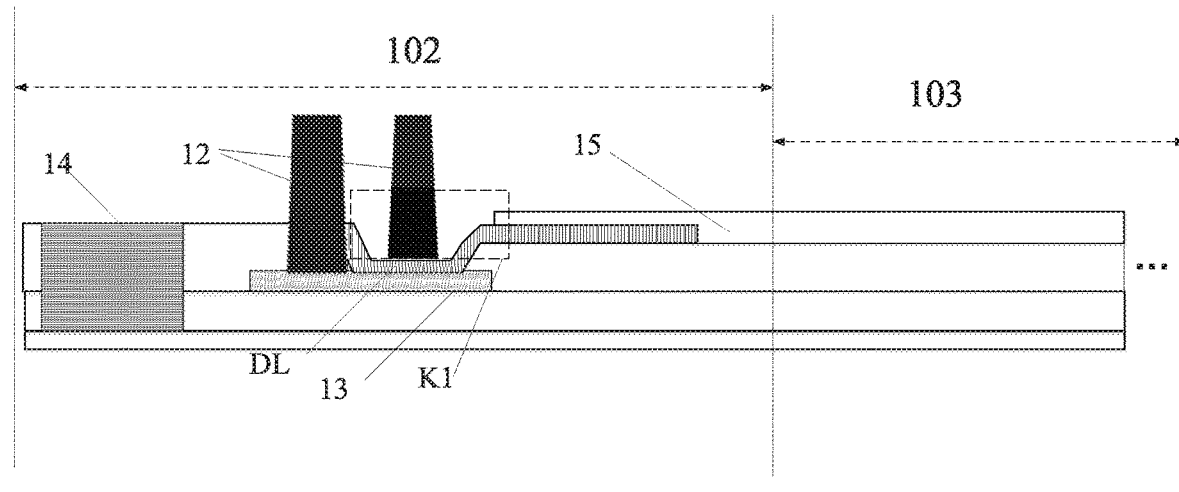
FIG. 7 is a cross-sectional view taken along line AA' in FIG. 6.
Figure 8:
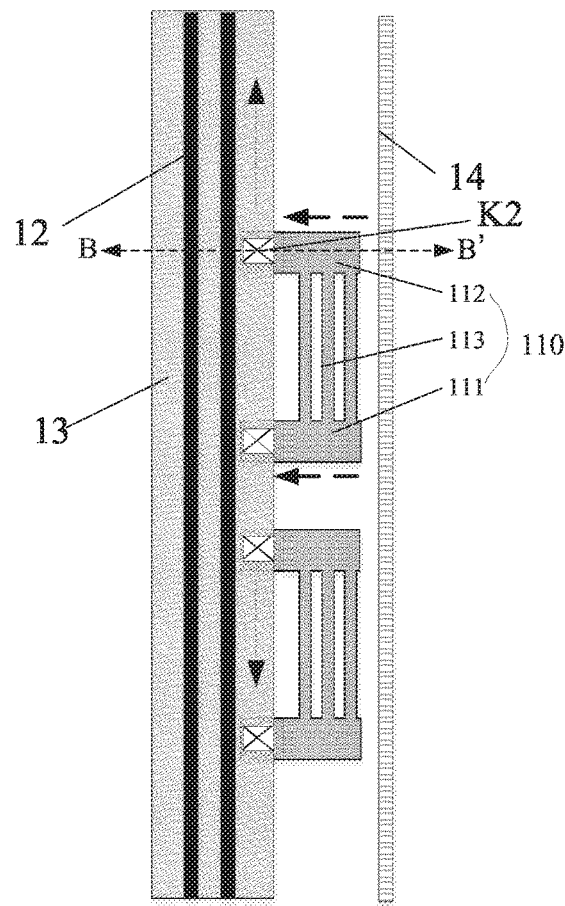
FIG. 8 is a structural schematic diagram showing an electrostatic protection unit in FIG. 6.
Figure 9:
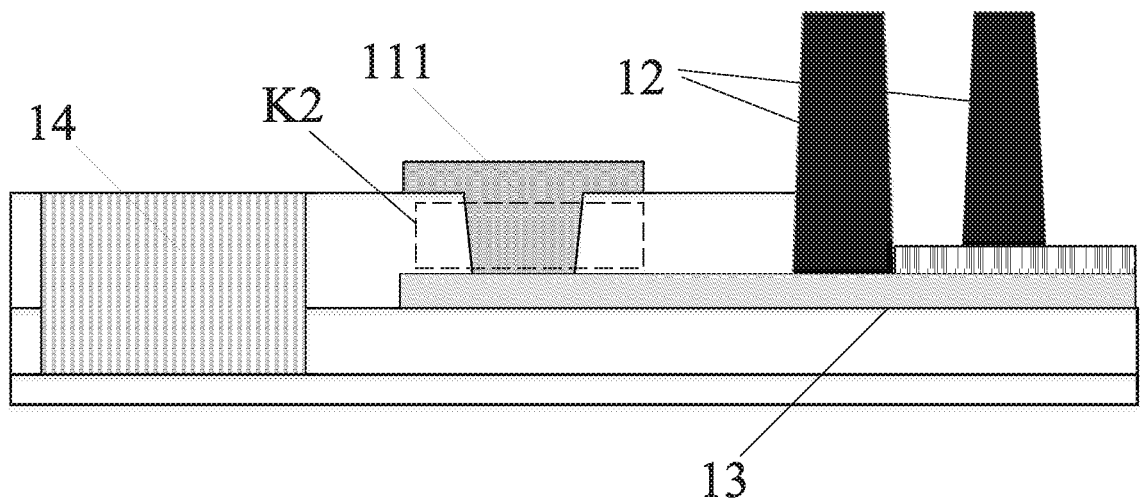
FIG. 9 is a cross-sectional view taken along line BB' in FIG. 8.
Figure 10:
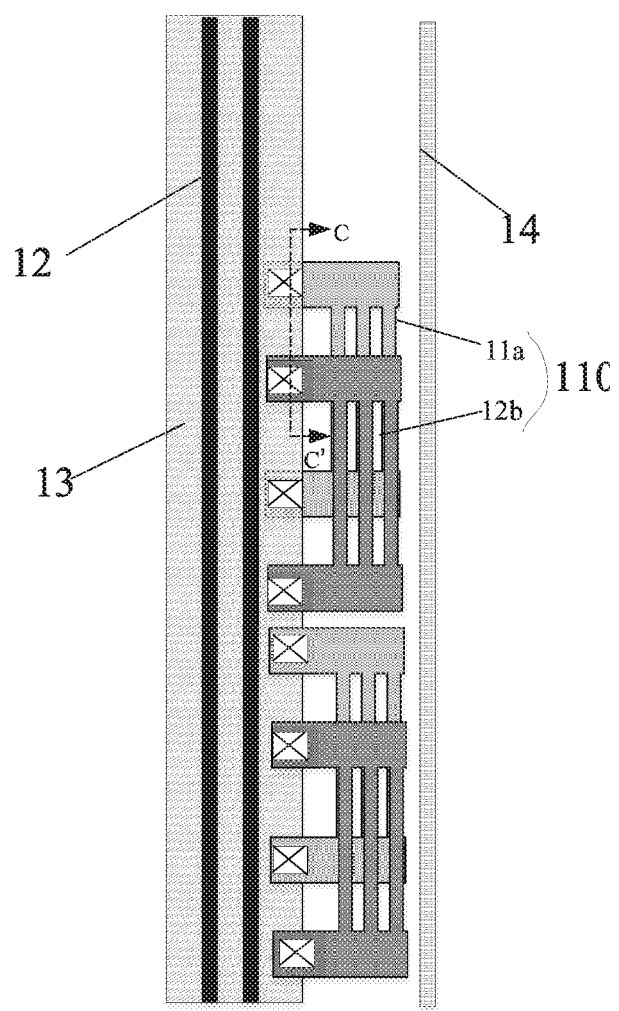
FIG. 10 is another structural schematic diagram showing the electrostatic protection unit in FIG. 6.
Figure 11:
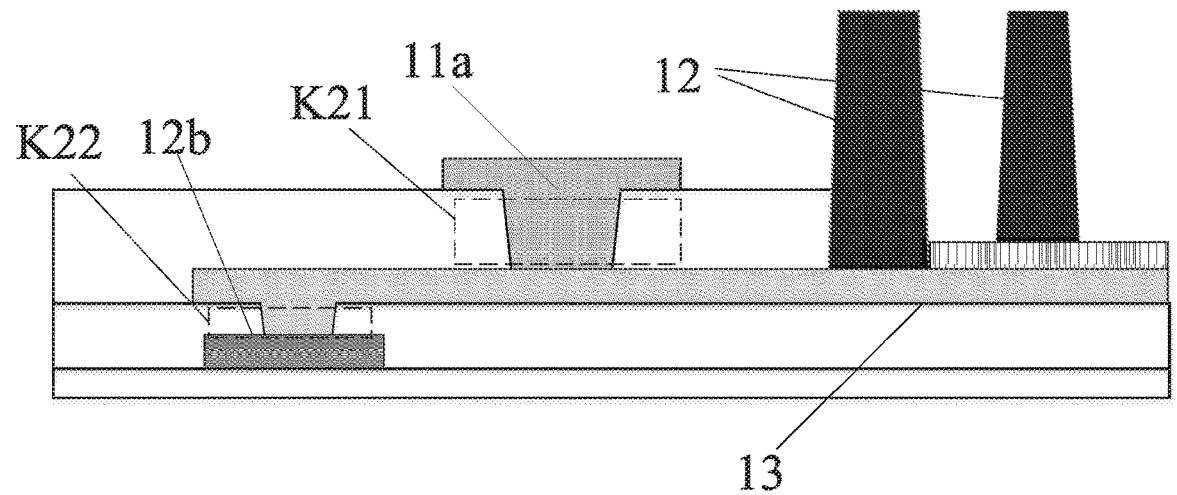
FIG. 11 is a cross-sectional view taken along line CC' in FIG. 10.
Figure 12:
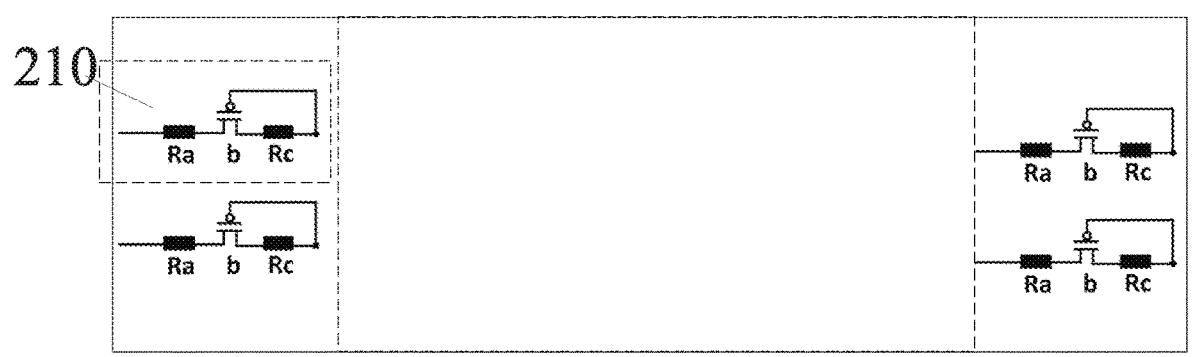
FIG. 12 is an equivalent circuit diagram of another electrostatic protection unit in a bending part 101 in FIG. 6.
Figure 13:
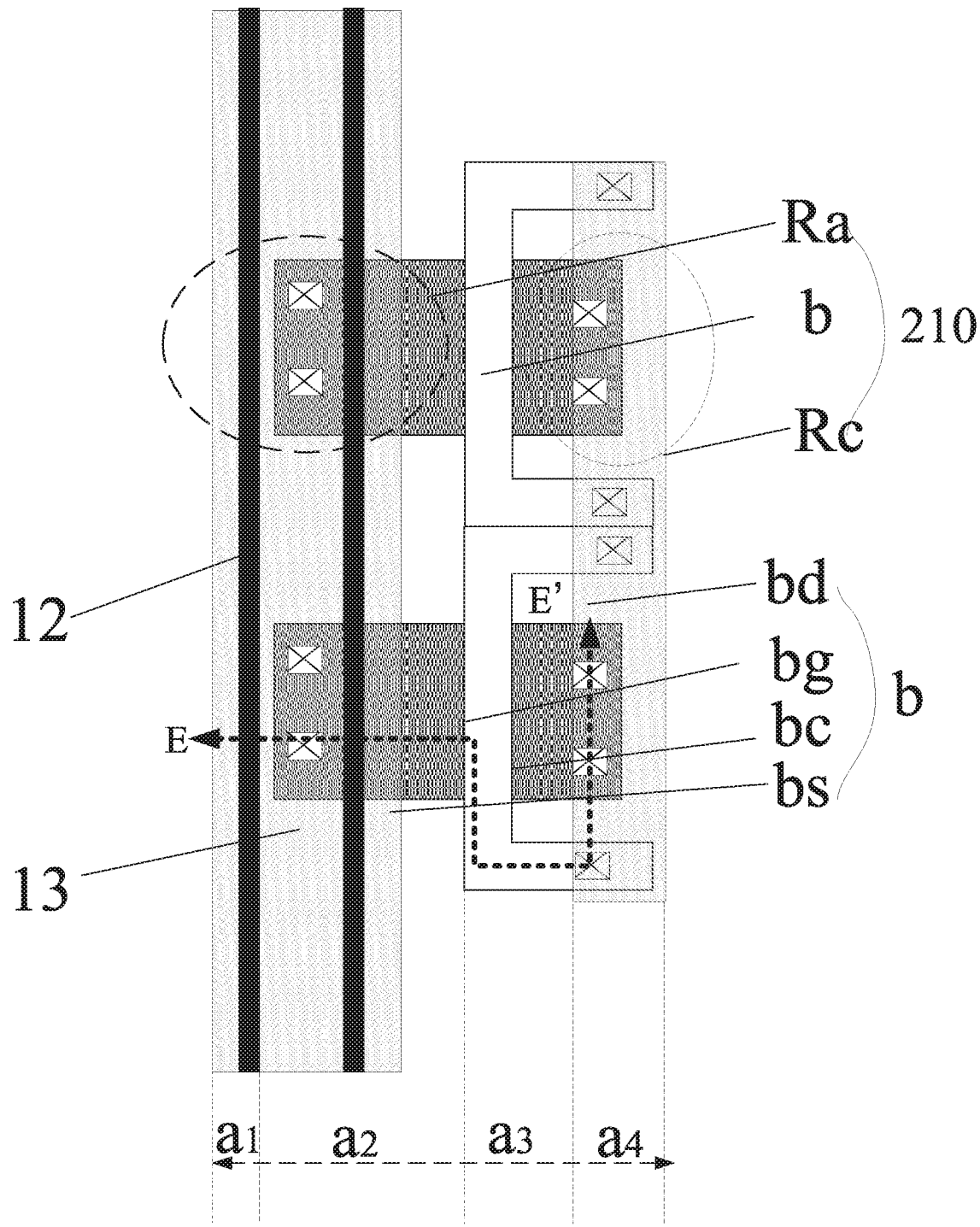
FIG. 13 is a structural schematic diagram showing the electrostatic protection unit in FIG. 12.
Figure 14:
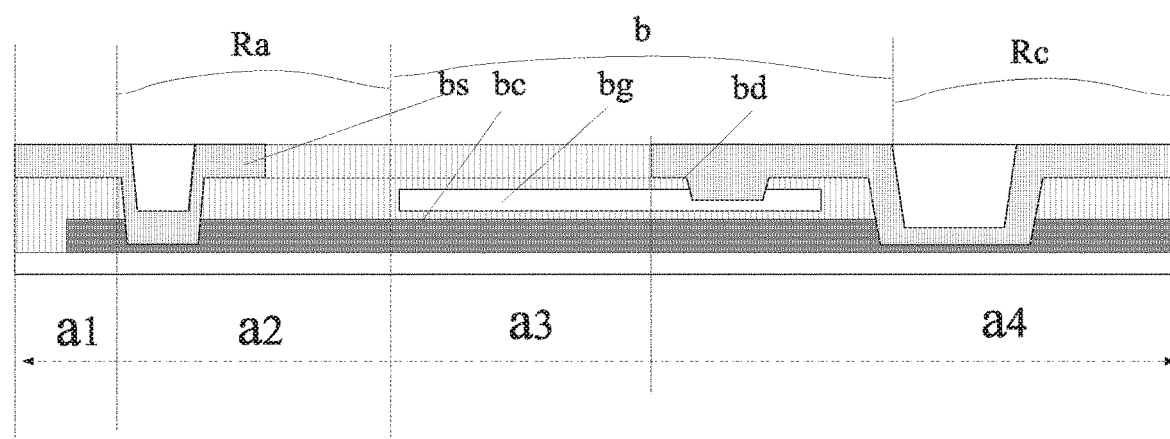
FIG. 14 is a cross-sectional view of regions a1-a4 in FIG. 13.
Figure 15:
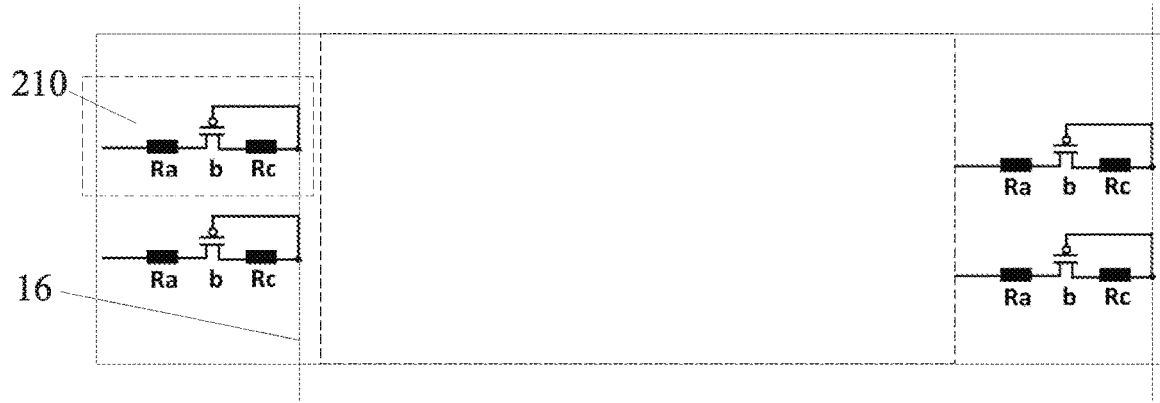
FIG. 15 is an equivalent circuit diagram of another electrostatic protection unit in a bending part 101 in FIG. 6.
Figure 16:
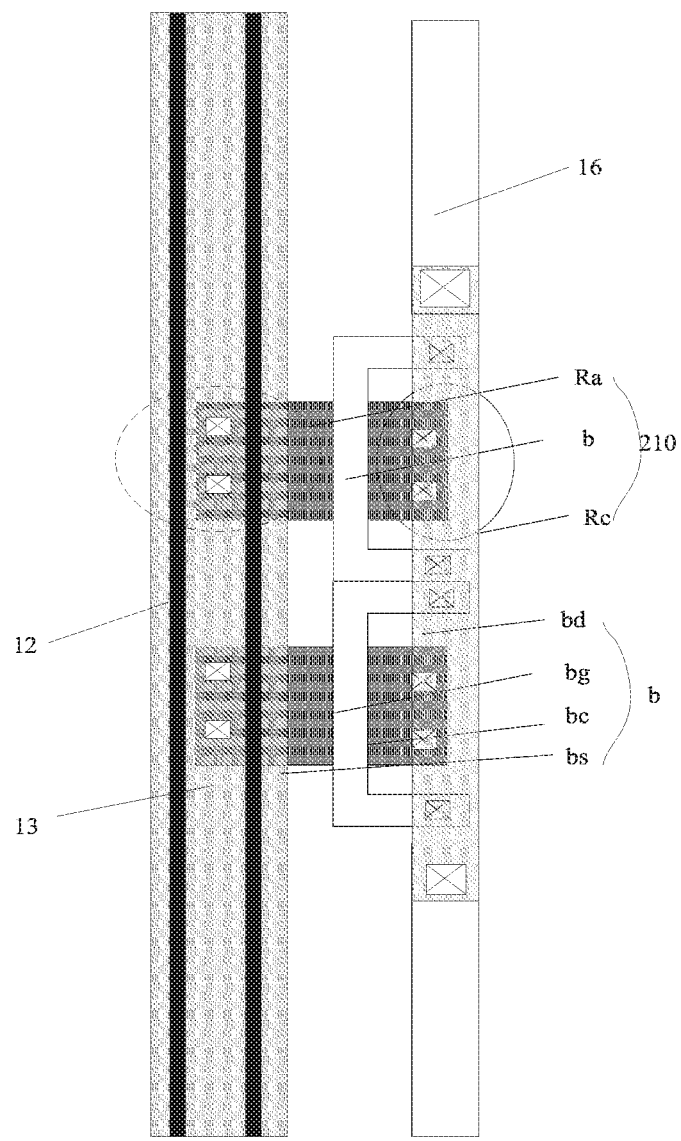
FIG. 16 is a structural schematic diagram showing the electrostatic protection unit in FIG. 15.
Figure 17:
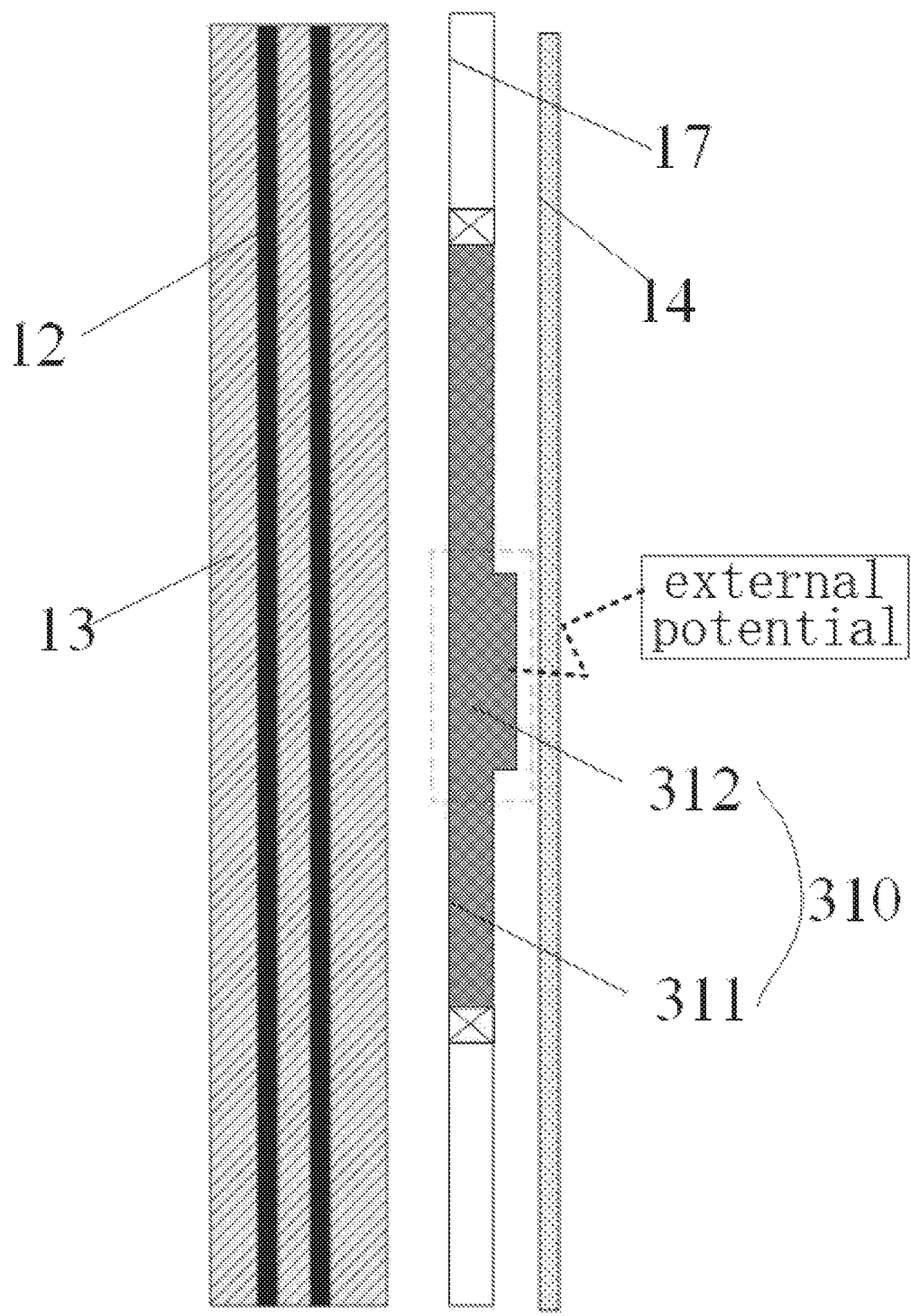
FIG. 17 is another structural schematic diagram showing the electrostatic protection unit in FIG. 6.

Regarding problems such as encapsulation failure because the electrostatic accumulation easily generated in the bending part of the flexible display panel in the prior art may damage the blocking wall in the electronic component of the display region and in the encapsulation structure of the non-display region, the inventors of the present disclosure have intensively studied to provide a solution. As shown in FIGS. 1-17, FIG. 1 is a structural schematic diagram showing a display panel according to an embodiment of the present disclosure; FIG. 2 is a schematic diagram showing the display panel in FIG. 1 in a bent state; FIG. 3 is a schematic diagram showing the display panel in FIG. 1 in another bent state; FIG. 4 is another schematic diagram showing the display panel in FIG. 1; FIG. 5 is another schematic diagram showing the display panel in FIG. 1; FIG. 6 is a structural schematic diagram showing a display panel according to another embodiment of the present disclosure; FIG. 7 is a cross-sectional view taken along line AA' in FIG. 6; FIG. 8 is a structural schematic diagram showing an electrostatic protection unit in FIG. 6; FIG. 9 is a cross-sectional view taken along line BB' in FIG. 8; FIG. 10 is another structural schematic diagram showing the electrostatic protection unit in FIG. 6; FIG. 11 is a cross-sectional view taken along line CC' in FIG. 10; FIG. 12 is an equivalent circuit diagram of another electrostatic protection unit in a bending part 101 in FIG. 6; FIG. 13 is a structural schematic diagram showing the electrostatic protection unit in FIG. 12; FIG. 14 is a cross-sectional view of regions a1-a4 in FIG. 13; FIG. 15 is an equivalent circuit diagram of another electrostatic protection unit in a bending part 101 in FIG. 6; FIG. 16 is a structural schematic diagram showing the electrostatic protection unit in FIG. 15; and FIG. 17 is another structural schematic diagram showing the electrostatic protection unit in FIG. 6. The present disclosure provides a display panel and a display device. By arranging an electrostatic protection unit in the non-display region (i.e., the left and right frame regions in the non-display region of the display panel) of the bending part in the display panel, the static electricity generated in the display panel during the bending operation is released, thereby preventing the electrostatic accumulation during the bending operation from causing breakdown of the transistor in the display region, and also preventing the electrostatic accumulation from causing a series of adverse effects to the electronic components such as the metal trace and the light-emitting unit on the display panel, and the blocking wall structure in the encapsulation structure.

Figure 1:
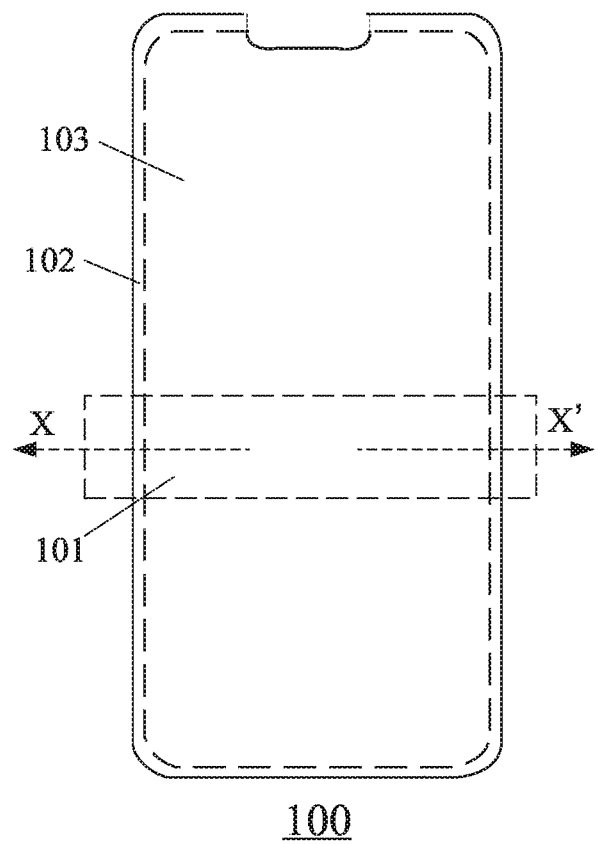
FIG. 1 is a structural schematic diagram showing a display panel according to an embodiment of the present disclosure.

As shown in FIG. 1, an embodiment of the present disclosure provides a display panel 100 including a display region 103, a non-display region 102 arranged surrounding the display region 103, and a bending part 101. The bending part 101 means that the display panel can be bent at different angles along a direction of a folding axis X-X'. As shown in FIG. 2, when the display panel 100 is completely symmetrically folded along the folding axis, the size of the display panel is reduced to half the size of the display panel in an unfolded state. Alternatively, as shown in FIG. 3, the display panel 100 can be folded along the folding axis in accordance with a folding mechanism (not shown in FIG. 3), and the bending portion 101 in a folded state presents an arc structure. Of course, in the embodiments of the present disclosure, the display panel can be folded toward the direction of the display screen, which can be simply referred to as "inward-folding"; and the display panel can also be folded facing away from the direction of the display screen, which can be referred to as "outward-folding". In addition, the bending part of the display panel includes a display region and a non-display region, and the display region in the bending part 101 includes a plurality of light-emitting units D11, as shown in FIG. 4. That is, the display region in the bending part 101 is possible to perform a normal display function as the other display regions.

The display panel in the embodiments of the present disclosure can be in a folded or bent state, because the flexible substrate used in the display panel 100 can ensure the flexible bendability of the display panel in the embodiments of the present disclosure. In the embodiments of the disclosure, the radius of curvature of the bending portion of the display panel is between 0.3 mm and 1.0 mm, thereby ensuring that the user can freely achieve the bending operation. Further, in the present disclosure, "bending" is a bending operation in different angular directions including symmetrical folding. FIGS. 2 and 3 only provide two different bent states as examples.

In the related art, the conventional flexible display product does not provide a corresponding electrostatic protection structure in the bending part. As a result, the conventional flexible display product has poor ESD (Electro-Static Discharge) capability in the bending part. The main reason of electrostatic accumulation generated in the display panel is the bending operation, which may cause frequent frictions among the driving array substrate, the light-emitting functional layer and the touch functional layer in the display panel, therefore the electrostatic accumulation is easily generated on the contact interface between the layers. When static electricity is accumulated to a sufficient extent, if there is nowhere to release, problems such as electrostatic damage to the transistors and the light-emitting units in the display region of the display panel and the blocking wall in the encapsulation structure of the non-display region may occur. To this end, an embodiment of the present disclosure provides a display panel 100. As shown in FIGS. 5-7, a first blocking wall 12 surrounding the display region 103 is arranged in the non-display region 102 of the display panel 100. In an embodiment of the present disclosure, the first blocking wall 12 is a part of a TFE (Thin-Film Encapsulation) structure (not shown) of the display panel 100. A main portion of the TFE structure covers the region where the display region 103 is located. The first blocking wall 12 is arranged in the non-display region 102 of the display panel and surrounds the display region 103. The first blocking wall 12 mainly serves to prevent the external water and oxygen from eroding the display panel. The first blocking wall 12 is an important component which can prevents the water and oxygen from intruding into the display panel, and generally is arranged in a double or multiple setting. In the embodiments of the present disclosure, two mutually nested first blocking walls 12 are arranged in the display panel to further prevent water and oxygen from entering the display panel. It can be seen that the protection for the first blocking wall 12 is very important. If the first blocking wall is damaged due to static electricity, the encapsulation structure of the display panel may be invalid, thereby causing a great decline in the service life of the entire display panel. Therefore, in the embodiments of the present disclosure, the electrostatic protection unit 11 is arranged in a position adjacent to the first blocking wall 12 in the non-display region of the bending part 101. That is, the electrostatic protection unit 11 is arranged at a side of the first blocking wall 12 away from the display region 103. It should be noted that the electrostatic protection unit 11 is merely an exemplary representation in FIGS. 5 and 6, which will be described in the following specific embodiments.

As shown in FIGS. 5 and 6, the display panel 100 according to the embodiments of the present disclosure further includes a first constant signal line 13 providing a constant low potential signal (generally speaking, it is around −5V) to the cathode 15 of the display panel. The constant low potential signal transmitted by the first constant signal line 13 is provided by the driving chip 104 corresponding to the display panel. As shown in the drawings, the driving chip 104 is generally located in a lower end region of the display panel. Since the first constant signal line 13 is a metal trace having a large area and provides a constant potential signal, it is a very good choice for discharging static electricity. In an embodiment of the present disclosure, by electrically connecting the electrostatic protection unit 11 to the first constant potential signal line 13, the static electricity accumulated on the electrostatic protection unit 11 passes through the first constant signal line 13. The specific connection manner between the electrostatic protection unit 11 and the first constant potential signal line 13 may be achieved by way of a through hole or bridging, which are not specifically limited in the embodiments of the present disclosure. It can be determined according to specific implementations.

For the cathode 15 of the display panel 100, the cathode is generally formed in a whole plane on the display panel in a manner of evaporation in the evaporation process of the display panel. The signal required by the cathode 15 is provided by the first constant signal line 13. The first constant signal line 13 is formed in the driving array substrate process of the display panel, so that the connection between the cathode 15 and the first constant signal 13 is required to be realized by a through hole and a connecting wire. As shown in FIG. 7, FIG. 7 is a cross-sectional view taken along line AA' in FIG. 6. As can be seen from FIG. 7, in an embodiment of the present disclosure, the connection between the cathode 15 and the first constant signal line 13 is realized by a through hole K1 and a connecting wire DL. It should be noted that, in order to enhance the protection for the first blocking wall 12, in the embodiments of the present disclosure, by arranging the first blocking wall 12 on the metal layer where the first constant signal 13 is located, the first blocking wall 12 directly contacts or is indirectly electrically connected to the first constant signal line 13, thereby the static electricity can be further discharged.

In addition, referring to FIGS. 6 and 7, since the display panel 100 provided in the embodiments of the present disclosure is a flexible display panel, in order to further increase the anti-bending performance of the flexible display panel and reduce the internal stress of the overall display panel, the display region 102 is further provided with an anti-crack structure 14 located on a side of the first blocking wall 12 away from the display region 103. The anti-crack structure 14 can surround the non-display region 102 so as to be approximately parallel to the first blocking wall 12. Of course, the anti-crack structure 14 may be arranged only in the left and right frame regions of the non-display region, for example, the anti-crack structure 14 can be arranged in a manner of being parallel to the first constant signal line 13. As shown in FIG. 6, in the embodiments of the present disclosure, the electrostatic protection unit 11 can be arranged between the first blocking wall 12 and the anti-crack structure 14.

Referring to FIG. 7, for the anti-crack structure 14, in the embodiments of the present disclosure, a groove structure is formed by etching the insulation layer, the metal functional layer or the semiconductor layer (a low temperature polysilicon layer or an oxide semiconductor layer) in the non-display region. By reducing the thickness at the non-display region 102, the stress generated in the display panel is reduced, thereby further improving the anti-bending performance of the display panel and achieving a predetermined bending curvature.

Next, the specific arrangement manner and corresponding structure of the electrostatic protection unit 11 in the embodiments of the present disclosure will be described in detail.

As shown in FIGS. 8 and 9, in the embodiments of the present disclosure, the electrostatic protection unit includes a first electrostatic protection unit 110 which may be formed by patterning a semiconductor layer and a metal conductive layer in the display panel 100. For example, the first electrostatic protection unit 110 is formed in the same layer as the semiconductor intrinsic layer of the transistor in the display panel. The first electrostatic protection unit 110 may be a low temperature polysilicon layer in the embodiments of the present disclosure. The low temperature polysilicon layer forming the first electrostatic protection unit 110 is heavily doped and has good electrical conductivity. Of course, in the embodiments of the present disclosure, the first electrostatic protection unit 110 can also be formed in the same layer as various metal trace such as data signal lines, scan signal lines, reference potential signal lines, and the like in the display panel. It is not limited herein, and the first electrostatic protection unit 110 is formed by using a conductive layer existed in the display panel, which can reduce the additional processing process and the corresponding material cost from the viewpoint of process cost. In addition, in the embodiments of the present disclosure, one or more first static protection units 110 may be arranged in the non-display region, and the corresponding design may be performed according to actual product requirements.

Referring to FIGS. 8 and 9 (FIG. 9 is a cross-sectional view taken along line BB' in FIG. 8), in the embodiments of the present disclosure, the first electrostatic protection unit 110 has a comb-tooth structure, and includes a first end portion 111, a second end portion 112 and a plurality of branches 113. The branch 113 is arranged to connect the first end portion 111 to the second end portion 112. The first end portion 111, the second end portion 112, and the plurality of branches 113 are formed by patterning the same metal layer. By collecting and accumulating the static electricity on the plurality of branches 113, the static electricity is guided to the first constant potential signal line 13 through the first end portion 111 and the second end portion 112 (in the direction of electrostatic conduction as indicated by the dotted arrow in FIG. 8). It should be noted that, in the embodiments of the present disclosure, the first constant potential signal line 13 and the first electrostatic protection unit 110 are patterned by different conductive layers. For example, in the embodiments of the present disclosure, the first constant potential signal line 13 and the data signal line (not shown) in the display panel are formed by patterning the same metal layer, and the first electrostatic protection unit 110 is formed by patterning the metal layer located above the first constant potential signal line 13. As shown in FIG. 9, since they are located in different metal layers, in the embodiments of the present disclosure, the first end portion 111 and the second end portion 112 of the first electrostatic protection unit 110 are connected to the first constant potential signal line 13 by a through hole K2, thereby realizing the electrical connection between the first constant potential signal line 13 and the first electrostatic protection unit 110.

In the embodiments of the present disclosure, by arranging the first electrostatic protection unit 110 adjacent to the first blocking wall 12, static electricity generated in the bending part 101 can be released and discharged through the first constant potential signal line 13, so that damaging to the first blocking wall 12 due to electrostatic accumulation and damaging to the transistor and the metal trace in the display region can be avoided.

In order to further enhance the electrostatic protection in the non-display region, the embodiments of the present disclosure further disclose an implementing manner of another electrostatic protection unit based on the above embodiments. As shown in FIGS. 10 and 11, the electrostatic 110 at least includes a first electrostatic protection sub-unit 11a and a second electrostatic protection sub-unit 12b. The first electrostatic protection sub-unit 11a and the second electrostatic protection sub-unit 12b are mutually stacked up. It should be noted that the first electrostatic protection sub-unit 11a and the second electrostatic protection sub-unit 12b have the same structure and are formed by different conductive layers, and both of them may partially overlap each other or may cover each other. FIG. 11 is a cross-sectional view taken along line CC' in FIG. 10. The first electrostatic protection sub-unit 11a and the second electrostatic protection sub-unit 12b are respectively located at different conductive layers with respect to the first constant potential signal line 13. The first electrostatic protection sub-unit 11a is electrically connected to the first constant potential signal line 13 via the through hole K21. The second electrostatic protection sub-unit 11b is electrically connected to the first constant potential signal line 13 via the through hole K22. Therefore, the electrical connection between the first constant potential signal line 13 and the first electrostatic protection unit 110 is achieved.

In the embodiments of the present disclosure, by providing a plurality of first electrostatic protection units 110, and the electrostatic protection units in different conductive layers have a dispersing and releasing effect for static electricity, thereby increasing the accumulation and release of static electricity by the electrostatic protection unit and further enhancing electrostatic protection to the first blocking wall 12 and the transistors and metal trace in the display region.

In order to further enhance the electrostatic protection in the non-display region, the embodiments of the present disclosure further disclose an implementing manner of another electrostatic protection unit based on the above embodiments. As shown in FIGS. 12-14, the electrostatic protection unit according to the embodiments of the present disclosure includes a second electrostatic protection unit 210 including at least a first transistor b and a first resistor Ra connected in series. The circuit diagram of the second static protection unit 210 is shown in the drawings. The first transistor can be a PMOS transistor. The gate electrode bg of the transistor b is electrically connected to the drain electrode bd of the first transistor b. The source electrode bs of the transistor is connected to the first resistor Ra. In addition, in the embodiments of the present disclosure, the second electrostatic protection unit 210 further includes a second resistor Rc connected in series between the gate electrode bg of the first transistor b and the drain electrode bd of the first transistor b. Thus, it can be seen that the first transistor forms a substantial diode by short-circuiting its gate electrode and drain electrode. For the first transistor b, in the embodiments of the present disclosure, the drain or gate electrode of the transistor is arranged in a float state without any potential. That is, the second electrostatic protection unit 210 is only electrically connected to the first constant potential signal line 13.

The structure and arrangement manner of the second electrostatic protection unit 210 will be described in detail below. FIG. 14 is a cross-sectional view of regions a1/a2/a3/a4 along the dashed line EE' in FIG. 13. The first blocking wall 12 is not shown in FIG. 14. For the first transistor b, the intrinsic layer be of the transistor is formed by patterning a semiconductor layer (which may be a low temperature polysilicon layer) in the display panel. That is, the intrinsic layer be of the transistor is formed in the same layer as the intrinsic layer of the transistor in the display region. In addition, the main portions of the first resistor Ra and the second resistor Rc are also formed by patterning the semiconductor layer, and their connection portions which is each connected to other components may be formed of other conductive layers. For example, in the embodiments of the present disclosure, the connection portions are formed by patterning the source-drain metal layers of the display panel. It should be noted that the semiconductor layer is used to form the resistor in the embodiments of the present disclosure, mainly because the resistivity of the semiconductor layer is easily adjusted. The adjustment of different sizes of the resistance can be achieved by adjusting the doping concentration in the semiconductor layer according to the requirements for the product design. For the first transistor b, the gate electrode bg of the transistor is formed by patterning a gate metal layer in the display panel, that is, the gate electrode bg of the transistor is formed in the same layer as the gate electrode of the transistor in the display region. The source electrode bs and the drain electrode bd of the transistor are formed by patterning the source-drain metal layer in the display panel, that is, the source electrode bs and the drain electrode bd of the transistor are formed in the same layer as the source-drain electrode of the transistor in the display region. In addition, in the embodiments of the present disclosure, the first constant potential signal line 13 is also formed by patterning the source-drain metal layers in the display panel.

In the embodiments of the present disclosure, the second electrostatic protection unit 210 is electrically connected with the first constant potential signal line 13 through the first resistor Ra. As shown in FIG. 14, the first constant potential signal line 13 is connected to the first resistor Ra by way of a through hole, that is, the source-drain metal layers where the first constant potential signal line 13 is located are connected to the semiconductor layer where the first resistor Ra is located by way of puncturing a through hole.

Referring to FIG. 13, some components of the second electrostatic protection unit 210 are arranged below the first blocking wall 12, that is, a partial region of the first resistor Ra is below the first blocking wall 12. Its main purpose is to achieve sufficient electrostatic protection for the first blocking wall 12.

In the above embodiments, the gate electrode and the drain electrode of the first transistor are short-circuited to form a diode and are connected in series to the resistor formed by the semiconductor layer so as to form an electrostatic protection unit. The electrostatic protection structure is formed synchronously by a process of forming a transistor in the display panel, which is simple to perform in terms of process cost.

In order to further enhance the electrostatic protection in the non-display region, the embodiments of the present disclosure further discloses an improvement for the second electrostatic protection unit 210 based on the above embodiments. As shown in FIGS. 15 and 16, the electrostatic protection unit according to the embodiments of the present disclosure includes a second electrostatic protection unit 210 including at least a first transistor b, a first resistor Ra and a second resistor Rc. The connection manner between the components is the same as that of the second electrostatic protection unit 210 described above, which is not elaborated herein. Specific improvements will be explained in detail below.

Referring to FIGS. 15 and 16, in the embodiments of the present disclosure, the display panel further includes a second constant potential signal terminal (not shown) providing a constant potential signal to the display panel. The constant potential signal may be one of a constant low level signal, a constant high level signal, and a constant ground signal. For example, the second constant potential signal terminal supplies a constant high level signal such as a PVDD signal, a constant reference potential signal such as a reset signal Verf or the like, or a ground zero potential signal GND or the like to the display surface. In the embodiments of the present disclosure, the drain electrode bd of the first transistor b is connected to the second constant potential signal terminal. The drain electrode bd of the first transistor b is connected to the second constant potential signal terminal through a first connection line 16. The connection line 16 may be arranged surrounding the non-display region (not shown). The first connection line 16 may be formed by patterning the same metal layer as the drain electrode bd of the first transistor b, or may be formed by patterning different metal layers. If they are patterned by using different metal layers, the electrical connection can be achieved by way of a through hole.

In the embodiments of the present disclosure, by connecting two electrostatic discharge terminals (i.e., the second constant potential signal terminal and the first constant potential signal line) to the second electrostatic protection unit 210, the accumulation and release of static electricity by the electrostatic protection unit is increased, thereby further enhancing electrostatic protection to the first blocking wall 12 and the transistors and metal trace in the display region.

In order to further enhance the electrostatic protection in the non-display region, the embodiments of the present disclosure further disclose an implementing manner of another electrostatic protection unit based on the above embodiments. As shown in FIG. 17, the electrostatic protection unit in the embodiments of the present disclosure includes a third electrostatic protection unit 310 including a contact bonding pad 312 and a pad lead 311 connected to the contact bonding pad. The contact bonding pad 312 and the pad lead 311 are formed by patterning the same metal layer. The contact bonding pad 312 is connected to an external ground potential outside the display panel through the pad lead 311. It should be noted that the external ground potential may be the ground potential on the corresponding mechanism module when the display panel is assembled into a display module, or may be the ground potential on the touch functional unit corresponding to the display panel. For a specific connection manner, the contact bonding pad 312 can be connected to an external ground potential by way of dropping silver paste. For example, the operation method of dropping silver paste process may include pouring a conductive paste such as a conductive silver paste, a carbon paste or a copper paste and the like into a predetermined through hole, and electrically connecting the contact pad 312 to an external ground potential by the through hole filled with the conductive paste.

In addition, the display panel further includes a third constant potential signal terminal providing a constant potential signal to the display panel. The constant potential signal may be one of a constant low level signal, a constant high level signal, and a constant ground signal. For example, the third constant potential signal terminal supplies a constant high level signal such as a PVDD signal, or a constant reference potential signal such as a reset signal Verf or the like, or a ground zero potential signal GND or the like to the display surface. In the embodiments of the present disclosure, one end of the third electrostatic protection unit 310 may be connected to a third constant potential signal terminal (not shown). That is, it can be connected to a second connection line 17 through the pad lead 311. The second connection line 17 may be arranged surrounding the non-display region (not shown). The second connection line 17 may be formed by patterning the same metal layer as the pad lead 311, or may be formed by patterning different metal layers. If both of them are patterned by using different metal layers, the electrical connection can be achieved by way of a through hole.

In the embodiments of the present disclosure, by connecting two electrostatic discharge terminals (i.e., the third constant potential signal terminal and the external ground potential) to the third electrostatic protection unit 310, the accumulation and release of static electricity by the electrostatic protection unit is increased, thereby further enhancing electrostatic protection to the first blocking wall 12 and the transistors and metal trace in the display region. In addition, in the embodiments of the present disclosure, electrostatic discharge is achieved by using an external ground potential, and the implementing manner of the electrostatic protection unit is very simple, and the pattern of the electrostatic protection structure is simple and does not excessively occupy the room of the non-display region.

In summary, different types of electrostatic protection units are provided in the present disclosure. In the present disclosure, various electrostatic protection units can be used at the same time, which is also within the protection scope of the present disclosure and are not elaborated herein.

Figure 18:
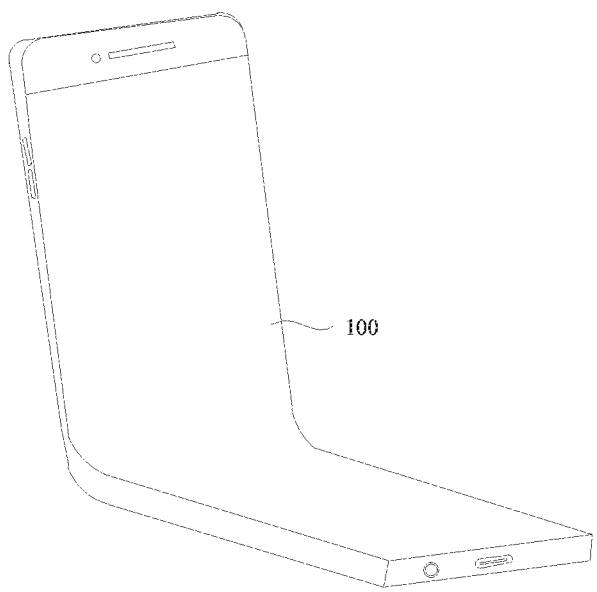
FIG. 18 is a structural schematic diagram showing a display device according to an embodiment of the present disclosure.

An embodiment of the present disclosure further provides a display device. FIG. 18 is a structural schematic diagram showing a display device according to an embodiment of the present disclosure. The display device includes the display panel 100 described above. The specific structure of the display panel 100 has been described in detail in the above embodiments, which is not elaborated herein. Of course, the display device shown in FIG. 12 is merely illustrative, and the display device may be any electronic device having a display function such as a mobile phone, a tablet computer, a laptop computer, an electronic paper book, or a television.

Since the display device provided by the embodiments of the present disclosure includes the above display panel, the display device is configured to arrange the electrostatic protection unit in the non-display region (i.e., left and right block regions in the non-display region of the display panel) of the bending part in the flexible display panel. According to the requirements for an actual product design, different electrostatic protection structures can be selected, and the electrostatic protection unit can be accessed to a large-area constant potential trace in the display panel to perform electrostatic discharge, and of course, the electrostatic protection unit can be externally connected to a constant potential such as the ground potential outside the display panel. In addition, in the embodiments of the present disclosure, by arranging an electrostatic protection unit in a encapsulation structure such as a first blocking wall region near the bending part, it is possible to prevent damage to the first blocking wall due to electrostatic accumulation in the bending part which may cause the failure of the encapsulation structure and the like.

The above are merely preferred embodiments of the present disclosure, which, as mentioned above, are not used to limit the present disclosure. Whatever within the principles of the present disclosure, including any modification, equivalent substitution, improvement, etc., shall fall into the protection scope of the present disclosure.

What is claimed is:

1. A display panel, the display panel being divided into a display region and a non-display region, wherein the display panel comprises:
   a first blocking wall arranged in the non-display region and surrounding the display region;
   a bending part;
   an electrostatic protection unit arranged in a part of the non-display region corresponding to the bending part and located on a side of the first blocking wall facing away from the display region; and
   a first constant potential signal line electrically connected to the electrostatic protection unit.

2. The display panel according to claim 1, further comprising a cathode electrode provided with a constant low voltage signal by the first constant potential signal line, wherein the electrostatic protection unit is connected to the first constant potential signal line by way of a through hole or bridging.

3. The display panel according to claim 1, further comprising an anti-crack structure in the non-display region, wherein the anti-crack structure is located on a side of the first blocking wall facing away from the display region and is arranged in parallel to the first blocking wall, and the electrostatic protection unit is arranged between the first blocking wall and the anti-crack structure.

4. The display panel according to claim 1, wherein the electrostatic protection unit comprises a first electrostatic protection unit, and the first electrostatic protection unit comprises a first end portion, a second end portion and a plurality of branches, wherein each of the plurality of branches is connected to the first end portion and the second end portion, respectively.

5. The display panel according to claim 4, wherein the display panel comprises a semiconductor layer, and the first electrostatic protection unit is formed by patterning the semiconductor layer.

6. The display panel according to claim 4, wherein the display panel comprises a plurality of metal layers, and the first electrostatic protection unit is formed by patterning one or more of the plurality of metal layers.

7. The display panel according to claim 4, wherein the display panel comprises a semiconductor layer and a plurality of metal layers, and the first electrostatic protection unit is formed by patterning the semiconductor layer and one of the plurality of metal layers.

8. The display panel according to claim 7, wherein the first electrostatic protection unit comprises at least a first electrostatic protection sub-unit and a second electrostatic protection sub-unit, the first electrostatic protection sub-unit and the second electrostatic protection sub-units are stacked.

9. The display panel according to claim 1, wherein the electrostatic protection unit comprises a second electrostatic protection unit comprising at least a first transistor and a first resistor, and the first transistor and the first resistor are connected in series; and
   wherein the first transistor has a gate electrode, a drain electrode and a source electrode, the gate electrode is electrically connected to the drain electrode, and the source electrode is connected to the first resistor.

10. The display panel according to claim 9, wherein the first resistor is electrically connected to the first constant potential signal line.

11. The display panel according to claim 10, wherein the second electrostatic protection unit further comprises a second resistor connected in series between the gate electrode of the first transistor and the drain electrode of the first transistor.

12. The display panel according to claim 10, wherein the drain electrode of the first transistor is suspended and is connected with no potential.

13. The display panel according to claim 10, wherein the display panel further comprises a second constant potential signal terminal connected to the drain electrode of the first transistor.

14. The display panel according to claim 13, wherein the drain electrode of the first transistor is connected to the second constant potential signal terminal through a first connection line, and the first connection line is arranged to surround the non-display region.

15. The display panel according to claim 13, wherein the second constant potential signal terminal supplies a constant potential signal to the display panel, and the constant potential signal includes one of a constant low level signal, a constant high level signal, and a constant ground signal.

16. The display panel according to claim 11, wherein the display panel comprises a semiconductor layer, and the semiconductor layer is patterned to form an intrinsic layer of the first transistor, the first resistor, and the second resistor.

17. The display panel according to claim 1, wherein the electrostatic protection unit comprises a third electrostatic protection unit, the third electrostatic protection unit comprises a contact bonding pad connected to an external ground potential outside the display panel.

18. The display panel according to claim 17, wherein the display panel further comprises a third constant potential signal terminal providing a constant potential signal to the display panel, and a terminal of the third electrostatic protection unit is connected to the third constant potential signal terminal.

19. The display panel according to claim 1, wherein the display panel comprises a flexible substrate, and the display panel is a bendable display panel and has a radius of curvature ranging from 0.3 mm to 1.0 mm.

20. A display device comprising the display panel according to claim 1.

* * * * *